US006892060B2

(12) United States Patent
Zheng

(10) Patent No.: US 6,892,060 B2
(45) Date of Patent: May 10, 2005

(54) FULLY INTEGRATED SELF-TUNED IMAGE REJECTION DOWNCONVERSION SYSTEM

(75) Inventor: Yuanjin Zheng, Singapore (SG)

(73) Assignee: Institute of Microelectronics, Singapore (SG)

(*) Notice: Subject to any disclaimer, the term of this patent is extended or adjusted under 35 U.S.C. 154(b) by 436 days.

(21) Appl. No.: 10/184,763

(22) Filed: Jun. 28, 2002

(65) Prior Publication Data

US 2004/0002323 A1 Jan. 1, 2004

(51) Int. Cl.[7] ............................................. H04B 1/00
(52) U.S. Cl. .................. 455/302; 455/63.1; 455/67.13; 455/323; 375/346
(58) Field of Search ................... 455/63.1, 67.11, 455/67.13, 226.1, 226.2, 232.1, 234.1, 296, 302, 313, 323, 334; 375/345, 346; 327/113

(56) References Cited

U.S. PATENT DOCUMENTS

| 4,696,055 | A | | 9/1987 | Marshall | 455/118 |
|---|---|---|---|---|---|
| 5,140,198 | A | | 8/1992 | Atherly et al. | 307/529 |
| 5,852,772 | A | * | 12/1998 | Lampe et al. | 455/302 |
| 5,870,670 | A | | 2/1999 | Ripley et al. | 455/304 |
| 5,937,341 | A | | 8/1999 | Suominen | 455/324 |
| 5,974,306 | A | | 10/1999 | Hornak et al. | 455/323 |
| 6,127,962 | A | | 10/2000 | Martinson | 342/20 |
| 6,137,999 | A | | 10/2000 | Lovelace et al. | 455/302 |
| 6,226,509 | B1 | * | 5/2001 | Mole et al. | 455/302 |
| 6,278,870 | B1 | * | 8/2001 | Davie et al. | 455/302 |
| 6,304,751 | B1 | * | 10/2001 | King | 455/302 |
| 6,560,449 | B1 | * | 5/2003 | Liu | 455/302 |
| 6,785,529 | B2 | * | 8/2004 | Ciccarelli et al. | 455/324 |

OTHER PUBLICATIONS

Thomas H. Lee, *The Design of CMOS Radio–Frequency Integrated Circuits*, Published by Cambridge University Press, NY, 1998, pp. 556–561.

J.Crols et al., "CMOS Wireless Tranceivar Design," Kluwar Academic Publishers 1997, pp. 52–62.

B. Razavi, RF Microelectronics, NJ: Prentice Hall, 1998, Chapter, 5, pp. 134–139.

Hsiao et al., "A Parallel Structure for CMOS Four–Quadrant Analog Multipliers, and Its Application to a 2–GHz RF Down–conversion Mixer, " IEEE Journal of Solid–State Circuits, vol. 33,No. 6, Jun. 1998, pp. 859–869.

Bult et al., "A CMOS Four–Quadrant Analog Multiplier," IEEE Journal of Solid–State Circuits, vol. sc–21, No. 3, Jun. 1986, pp. 430–435.

Gregorian et al., Analog MOS Integrated Circuits for Signal Processing, NJ: John Wiley and Sons, 1986, pp. 424–433.

Johns et al., Analog Integrated Circuit Design, NJ: John Wiley and Sons, 1997, pp. 342–349 and 366–369.

(Continued)

*Primary Examiner*—Quochien B. Vuong
(74) *Attorney, Agent, or Firm*—George O. Saile; Stephen B. Ackerman

(57) ABSTRACT

A feedback image rejection downconversion system is described, which can be used in low IF receivers with good performance and completely integrated. In the forward path of the system, quadrature mixers and complex filters are used for frequency downconversion and separation of the RF signal from the image signal. In the feedback path, a correlator, a gain mismatch estimator and two VGAs have been used to detect, estimate and compensate the amplitude and phase mismatch between the forward I and Q path signals. The whole system is self-tuned and can operate in both closed and open loop mode. A very high and robust image rejection ratio (over 60 dB) has been achieved.

26 Claims, 13 Drawing Sheets

OTHER PUBLICATIONS

Crols et al., "A Single–Chip 900 MHz CMOS Reciever Front–End with a High Performance Low–IF Topology," IEEE Journal of Solid–State Circuits, vol. 30, No. 12, Dec. 1995, pp. 1483–1492.

Crols et al., "Low–IF Topologies for High–Performance Analog Front Ends of Fully Integrated Receivers," IEEE Trans, on Circuits and Systems–II : Analog and Digital Signal Processing, vol. 45, No. 3, Mar. 1998, pp. 269–282.

Behbahani; et al., "A 2.4–GHz Low–IF Receiver for Wideband WLAN in 0.6µM CMOS–Architecture and Front–End," IEEE Jrnl. of Solid–State Circuits, vol. 35, No. 12, Dec. 2000, pp. 1908–1915.

Rudell et al., "A 1.9 GHz Wide–Band IF Double Conversion CMOS Receiver for Cordless Telephone Applications," IEEE Journal of Solid–State Circuits, vol. 12, Dec. 1997, pp. 2071–2088.

Chum et al., "On the Architecture and Performance of a Hybrid Image Rejection Reciever," IEEE Journal on Selected Areas in Communications, vol. 19, No. 6, Jun. 2001, pp. 1029–1040.

Li Yu et al., "A Novel Adaptive Mismatch Cancellation System for Quadrature IF Radio Receivers," IEEE Trans. on Circuits and Systems–II: Analog and Digital Signal Processing, vol. 46, No. 6, Jun. 1999, pp. 789–801.

Valkama et al., "Advanced DSP for I/Q Imbalance Compensation in a Low–IF Receiver," 2000 IEEE Int'l Conf. on Communications, vol. 2, pp. 768–772.

Valkama et al., "Advanced Methods for I/Q Imbalance Compensation in Communication Receivers," IEEE Trans. on Signal Processing, vol. 49, No. 10, Oct. 2001.

* cited by examiner

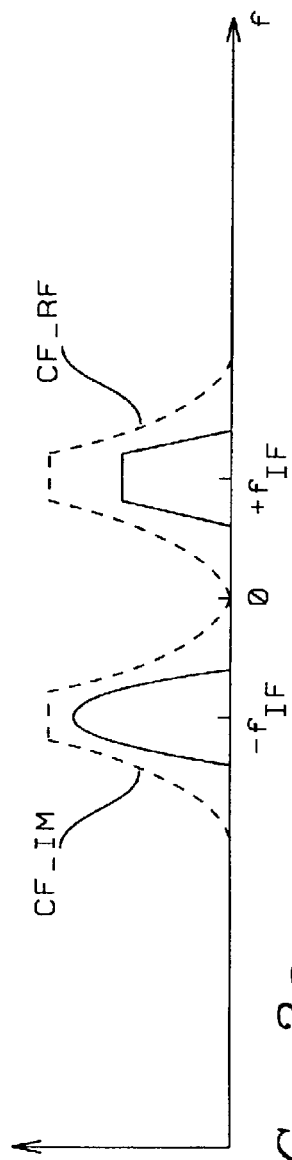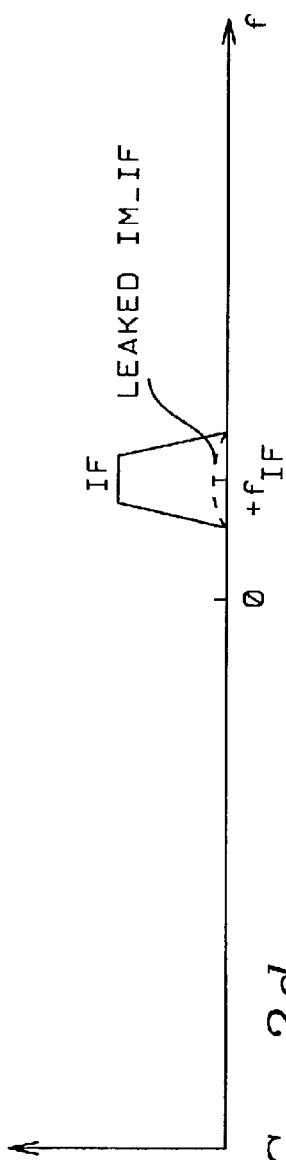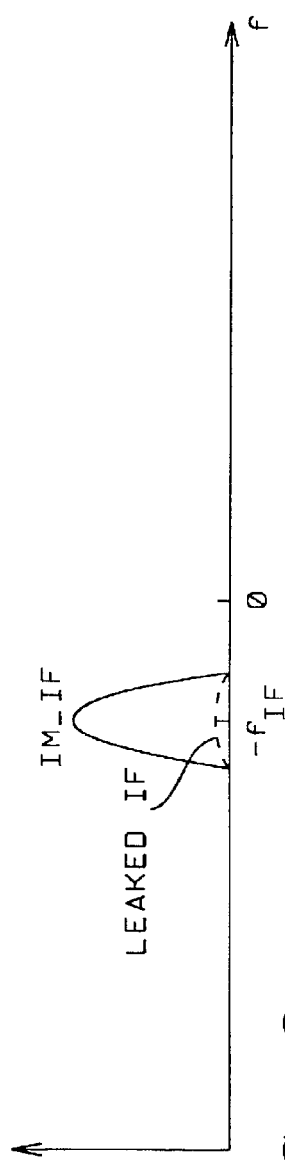
FIG. 2c
FIG. 2d
FIG. 2e

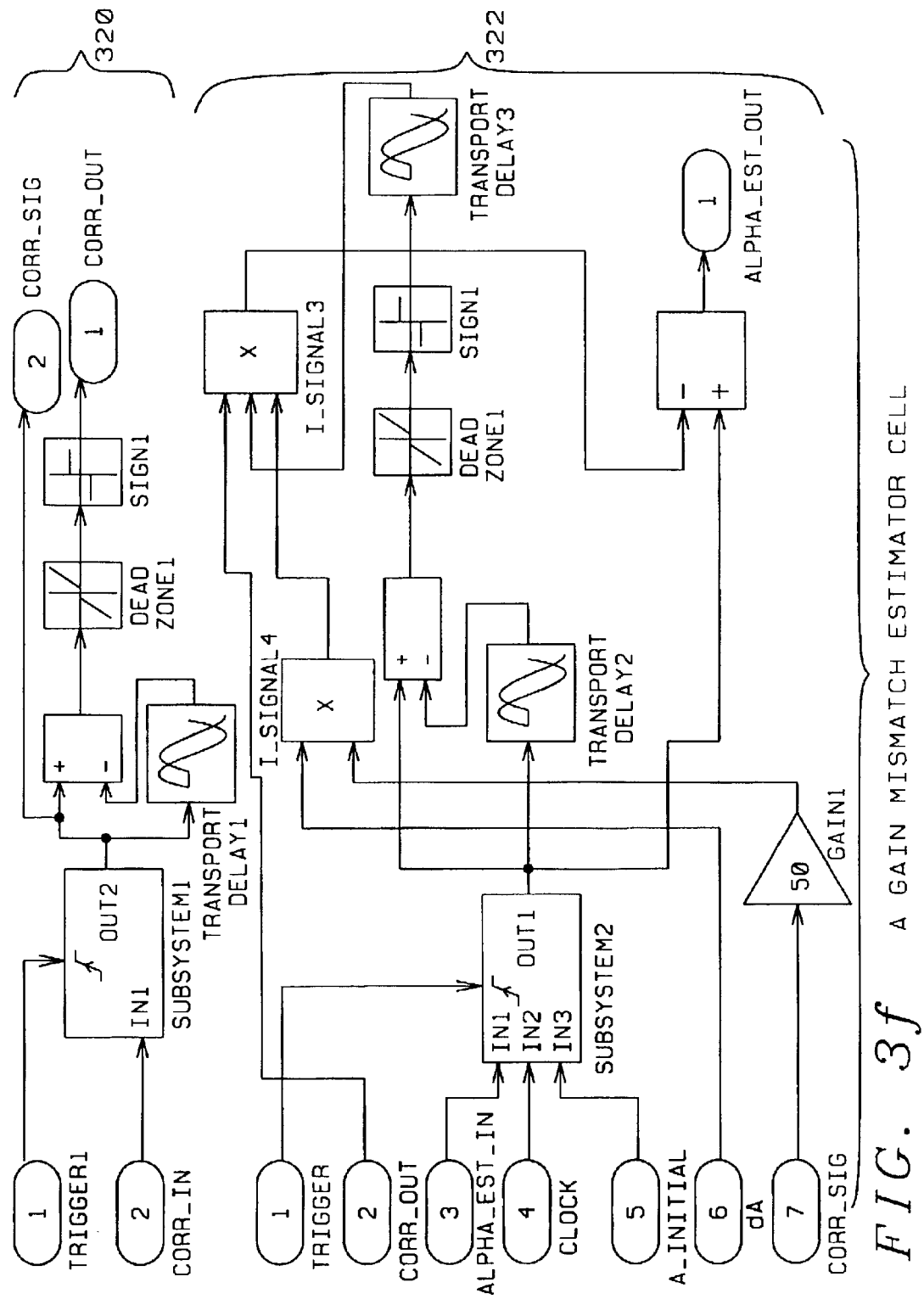
FIG. 3f    A GAIN MISMATCH ESTIMATOR CELL

FULLY INTEGRATED SELF-TUNED IMAGE REJECTION DOWNCONVERSION SYSTEM

BACKGROUND OF THE INVENTION

1. Field of the Invention

The invention relates to a downconversion system used in low intermediate frequency (IF) receivers, and more particularly to a downconversion system for low IF receivers with a high image rejection ratio (IRR) of more than 60 dB for use in analog integrated circuits (IC).

2. Description of the Related Art

With the rapid development of wireless communication and IC design technology, wireless transceiver system design and implementation has experienced great evolutions. A very high degree of integration, a low power consumption, and the use of a lower power supply are the goals set for the new development in wireless transceiver design. Although classically the heterodyne multistage intermediate frequency (IF) receiver has good performance in sensitivity and selectivity, it needs a high Q image rejection filter working in high frequency, see J. Crols and M. Steyaert, *CMOS Wireless Transceiver Design*, Kluwer Academic Publishers, 1997 and B. Razavi, *RF Microelectronics*, NJ: Prentice Hall, 1998. This component has to be external and power consumed. A Zero-IF receiver can be fully integrated and has no problem in image rejection, but it has some disadvantages such as DC offset, I/Q mismatch and cross modulation between RF and LO signal, see T. H. Lee, *The Design of CMOS Radio-Frequency Integrated Circuits*, U.K.: Cambridge Univ. Press, 1998, the J. Crols and the B. Razavi articles referred to earlier. A promising architecture is a low IF receiver, which can be fully integrated by employing some new techniques for image rejection, see the J. Crols article referred to earlier.

The low IF receiver combines the advantage of both the IF and zero IF receiver. It can achieve the good performance as well as a high degree of integration, see the Crols article referred to earlier, and J. Crols and M. Steyaert, "A single-chip 900 MHz CMOS receiver front-end with a high performance low-IF topology," *IEEE Journal of Solid State Circuits*, vol. 30, no.12, pp. 1483–1492, 1995, and J. Crols and M. Steyaert, "Low-IF Topologies for high performance analog front ends of fully integrated receivers," *IEEE Transactions on Circuits and Systems-II: Analog and Digital Signal Processing*, vol. 45, no. 3, pp.269–282, 1998.

The main problem of the low IF receiver is it is not easy to attain the high image rejection with this architecture, i.e. to separate well the desired RF signal from the image signal, see the J. Crols and M. Steyaert, *CMOS Wireless Transceiver Design* and B. Razavi articles referred to earlier. It is well known the frequency spacing between the desired RF signal and the image signal is two times the selected IF value. In the low IF receiver architecture, the selected IF is low and thus the frequency spacing between the desired RF signal and the image signal is very narrow. If the image rejection is done after low noise amplifier but before mixers, a high Q image rejection filter with very sharp transition band is needed to separate the RF signal from the image signal in high frequency. Obviously, this filter is very difficult to implement and commonly cannot be integrated. To overcome this problem, it is necessary to postpone the image rejection to a stage which is located after the downconversion mixers, and then the separation of the desired signal and image signal can be done in the low IF band.

Generally speaking, there are two methods for image rejection in a low IF receiver. One is to follow the quadrature mixers with a complex filter or a polyphase filter, see the J. Crols and M. Steyaert, *CMOS Wireless Transceiver Design* article referred to earlier, and F. Behbahani et al., "A 2.4 GHz low-IF receiver for wideband WLAN in 0.6 um CMOS-architecture and front-end," *IEEE Journal of State Circuits*, vol. 35, no. 12, pp. 1908–1915, 2000. After downconversion by the quadrature mixers, the RF signal and the image signal will be shifted into the symmetrical positive and negative IF band, respectively. A complex filter has only a positive or negative frequency passband transfer function (selectivity) (with $+f_{IF}$ or $-f_{IF}$ as its central frequency) and thus can be used to pass the desired IF signal and reject the image IF signal at the same time, see the three articles referred to earlier:

J. Crols and M. Steyaert, "CMOS Wireless Transceiver Design",

J. Crols and M. Steyaert, "A single-chip 900 MHz CMOS receiver front-end with a high performance low-IF topology," and J. Crols and M. Steyaert, "Low-IF Topologies for high performance analog front ends of fully integrated receivers".

Similarly, a polyphase filter has only a stopband in the negative or positive IF band and thus can be used to 'trap' the image IF signal and pass the desired signal, see the F. Behbahani article referred to earlier. The other method is to use an image rejection mixer for image rejection. The Hartley architecture and Weaver architecture are two kinds of typical image rejection mixers, see the B. Razavi article referred to earlier. The idea of image rejection mixers is to process the signal and the image differently, and cancel the image by its negated replica. This distinction between the signal and the image is possible because the two lie on different sides of LO frequency, and thus phase transformation can be explored to cancel the image signal only.

Unfortunately, the image rejection ratio (IRR) provided by either of the above methods is very sensitive to I/Q mismatch of a low IF receiver, as discussed in the J. Crols and M. Steyaert, "*CMOS Wireless Transceiver Design*", B. Razavi, and J. Crols and M. Steyaert, "A single-chip 900 MHz CMOS receiver front-end with a high performance low-IF topology," articles referred to earlier. The ideal image rejection only happens in the case that the phases of I/Q local oscillator (LO) signals keep exact 90° difference and the gains of I/Q mixers are exactly equivalent. However, it is impossible to attain this perfect matching in current analog IC design process. The phase mismatch between the LOs and the gain mismatch between the mixers are inevitable. More importantly, the IRR is very sensitive to these mismatches and the image rejection performance will degrade greatly even with a small amount of mismatches, see J. C. Rudell et al., "A 1.9-GHz wide-band IF double conversion CMOS receiver for cordless telephone applications," *IEEE Journal of Solid-State Circuits*, vol. 32, no. 12, pp. 2071–2088, 1997. For example, using a $4^{th}$ order Butterworth complex filter for image rejection, when not any mismatch exists for I/Q Los and mixers, the IRR can attain over 77 dB. While with only 1° phase mismatch of LOs, IRR goes down to 40 dB. With 2% gain mismatch of mixers, IRR goes down to 39 dB. With 2° phase mismatch of Los and 2% gain mismatch of mixers, IRR goes down to 32 dB. Due to this reason, the currently implemented low IF receivers only can attain 30–40 dB image rejection ratio except adopting some complex trimming and tuning techniques, see C. C. Chun and C. H. Chia, "On the architecture and performance of a hybrid image rejection receiver," *IEEE Journal on Seclected Areas in Communications*, vol. 19, no. 6, pp. 1029–1040, 2001. So how much image rejection is adequate? In most RF applications and by using the low IF architecture, the image signal can be 60 dB larger than the desired RF signal so that the overall IRR must be around 60 to 70 dB, see the B. Razavi article referred to earlier. The matching requirements have put a big challenge to this topology.

In the literature, several methods have been proposed to improve the IRR of low IF receivers. One is to convert the low IF signal into the baseband signal by employing bandpass delta-sigma modulator, then I/Q mismatch can be cancelled and compensated through various digital signal processing algorithms in digital domain, see Li Yu and W. M. Snelgrove, "A novel adaptive mismatch cancellation system for quadrature IF radio Receivers," *IEEE Transactions on Circuits and Systems-II: analog and Digital Signal Processing*, vol. 46, no. 6, pp. 789–801, 1999, M. Valkama, and M. Renfors, "Advanced DSP for I/Q imbalance compensation in a low-IF receiver," 2000 *IEEE International Conference on Communications*, vol. 2, pp. 768–772, and M. Valkama, M. Renfors, and V. Koivunen, "Advanced methods for I/Q imbalance compensation in communication receivers," *IEEE Transactions on Signal Processing*, vol. 49, no.10, pp. 2335–2344, 2001. High IRR can be attained (50–70 dB) but the cost and complexity of this kind of method is also significantly increased due to the using of DSP. An interesting double quadrature mixer plus complex filter architecture is proposed in the J. Crols and M. Steyaert, "A single-chip 900 MHz CMOS receiver front-end with a high performance low-IF topology," article referred to earlier, which can achieve phase accuracy of less than 0.3 degree. Although it is a powerful way to overcome the sensitivity of IRR to phase mismatch, it still does not solve the problem of IRR sensitivity to amplitude mismatch.

Image rejection mixer and polyphase filter are used for image rejection in U.S. Pat. No. 6,127,962 (Martinson), "Image rejection mixer" and U.S. Pat. No. 6,226,509 (Mole et al.), "Image rejection mixer, circuit, and method for image rejection", but no tuning scheme is introduced to improve the image rejection ratio in these two inventions. Quadrature mixers are used for image rejection in U.S. Pat. No. 5,937,341 (Suominen), "Simplified high frequency tuner and tuning method." The phase mismatch and amplitude errors are corrected through a coarse stepwise tunable local oscillator and fine-tuning is performed in near baseband passband after an A/D conversion. Additional complexity has been introduced by using baseband signal compensation method. A fully integrated image rejection mixer was invented in U.S. Pat. No. 5,870,670 (Ripley et al.), "Integrated image reject mixer." To maintain an accurate ninety degree phase difference between the quadrature IF signals, a phase detector feedback loop is employed to control the matching between the LO phase shifting network and IF phase shifting network. A radio frequency tuning circuit is used to reject image frequency in U.S. Pat. No. 4,696,055 (Marshall), "RF tuning circuit which provides image frequency rejection." The circuit includes an N-path filter with tunable local oscillator for phase matching and a feedback loop to displace the central frequency of N-path filter from the local oscillator frequency. An image reject transceiver is invented in U.S. Pat. No. 6,137,999 (Lovelace et al.), "Image reject transceiver and method of rejecting an image" that can provide both phase and gain adjustments that causes unwanted images to be rejected. Both a phase detector circuit and an amplitude detector circuit are used to detect the I/Q mismatches. A pair of double balanced mixers are employed in an integrated IF receiver for image rejection in U.S. Pat. No. 5,140,198 (Atherly et al.), "Image canceling mixer circuit on an integrated circuit chip." The phase shift circuit employs a specific arrangement of transistors to produce a precise 90 degree phase shift. Emitter current of the transistor is adjustable to compensate for production variations and process mismatches. In the three above cited U.S. Pat. Nos. 4,696,055, 6,137,999, and 5,140,198, to eliminate the phase mismatch between quadrature mixers, adjustable phase shifters have to be used which inevitably increase the complexity of compensation and also decrease the compensation precision. A time-shared I-Q mixer system is invented in U.S. Pat. No. 5,974,306 (Hornak et al.), "Time-share I-Q mixer system with distribution switch feeding in phase and quadrature polarity inverters" for canceling the image signal. It includes a switch assembly, polarity inverters, and clock generator. The switch assembly generates and distributes pulses which ensure the orthogonality of the in-phase and out-phase signal. A current-mode field-effect-transistor implementation ensures the gain match. A complex filter and image rejector are then used to cancel an image signal. Due to the time sharing scheme, the clock used in this invention may be very high if it is used in high frequency applications.

In this invention, quadrature mixers combined with complex filters are used for image rejection. A matching compensation technique is developed which can cancel the phase and gain mismatch before the complex filter directly in IF domain. The idea is to construct a feedback loop which can automatically detect the degree of mismatch and then eliminate them by a compensation circuits. To implement this, a correlator, a gain mismatch estimator and two variable gain amplifiers (VGA) are used in the feedback loop, which all can be integrated in analog integrated circuits. It is self-tuning and can operate in either open loop or closed loop mode. Very high IRR (>60 dB) can be attained reliably which make it a promising architecture for future wireless transceiver applications.

SUMMARY OF THE INVENTION

It is an object of at least one embodiment of the present invention to provide a system and a method for an image rejection downconversion system for use in a low intermediate (IF) receiver with a high image rejection ratio (IRR) of greater than 60 dB.

It is another object of the present invention to have the whole system operate in a closed loop mode as well as open loop (after compensation) mode.

It is yet another object of the present invention to provide a self-tuning image rejection system with very fast settling time and high adjusting precision.

It is still another object of the present invention to have this system fully integrated and applied in most wireless receiver systems, including GSM, DECT, WCDMA, Bluetooth, and Wireless LANs.

It is yet a further object of the present invention to provide a system where the I/Q mismatch in the forward path of a receiver can be automatically canceled using the received RF and image signal and where no extra calibration signal is required.

It is still a further object of the present invention to provide a system which can be fully integrated with low cost analog circuits and which can be easily integrated into a single chip RF+IF receiver.

These and many other objects have been achieved whereby image rejection is implemented by following a quadrature (I/Q) mixer with a complex filter which is tuned to the desired IF signal passband. The phase mismatch of the I/Q local oscillators and the gain mismatch of the I/Q mixers is eliminated by designing a feedback loop to automatically compensate the matching of the forward I/Q path. In the feedback loop a correlator is used to detect the I/Q mismatches and a gain mismatch estimator is employed to estimate the degree of the mismatches which are needed to be compensated. Further, two variable gain amplifiers (VGAs) are inserted between the I/Q mixer and the complex filter to adjust the gains between I/Q paths so that the phase and amplitude mismatch of the I/Q forward path can be completely eliminated.

BRIEF DESCRIPTION OF THE DRAWINGS

FIGS. 2(a)–(e) illustrate the method of the signal spectrum processing in the forward path.

FIGS. 3(a)–(f) detail the simulation setup for the self-tuning image rejection downconversion system.

DESCRIPTION OF THE PREFERRED EMBODIMENT

Figure 1:
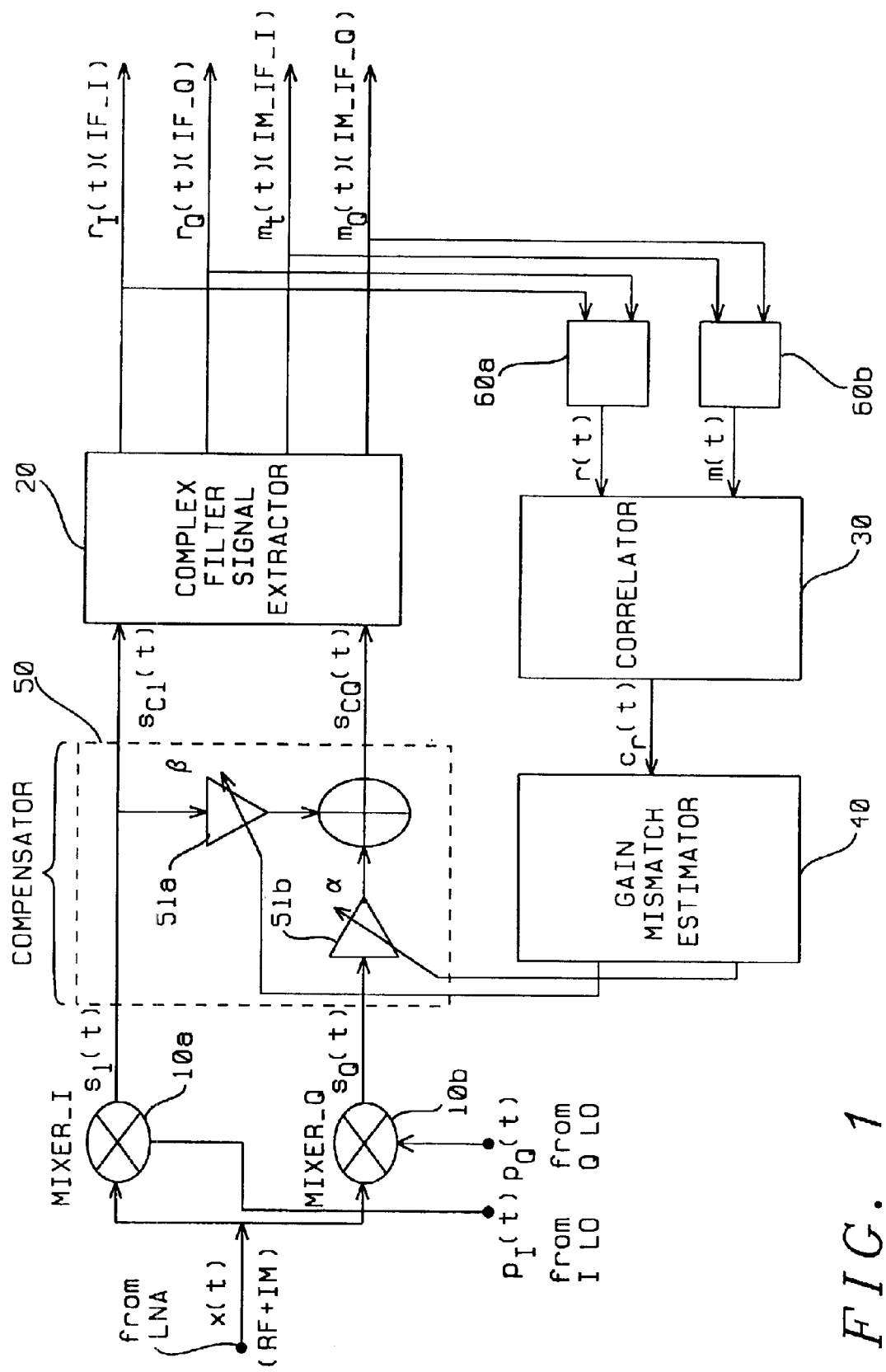
FIG. 1 is a block diagram of the self-tuning image rejection downconversion system architecture of the preferred embodiment of the present invention.

The proposed architecture is shown in FIG. 1. It includes two paths: the forward path and the feedback path. The forward path is composed of quadrature I and Q (I/Q) mixers 10a, 10b (with two I/Q local oscillators—LOs) and a complex filter signal extractor 20, which is used for frequency downconversion and image rejection. The feedback path is composed of a correlator 30, a gain mismatch estimator 40 and a compensator 50 (with two variable gain amplifiers 51a and 51b) coupled between the I/Q mixers and the, which is used for detecting, estimating and canceling the I/Q mismatches between I/Q mixers and I/Q LOs. Coupled between the complex filter signal extractor and the correlator are blocks 60a and 60b for combining signals from the complex filter signal extractor.

Referring to FIG. 1, the basic principle of the invention is as follows.

Figures 2A, 2B:
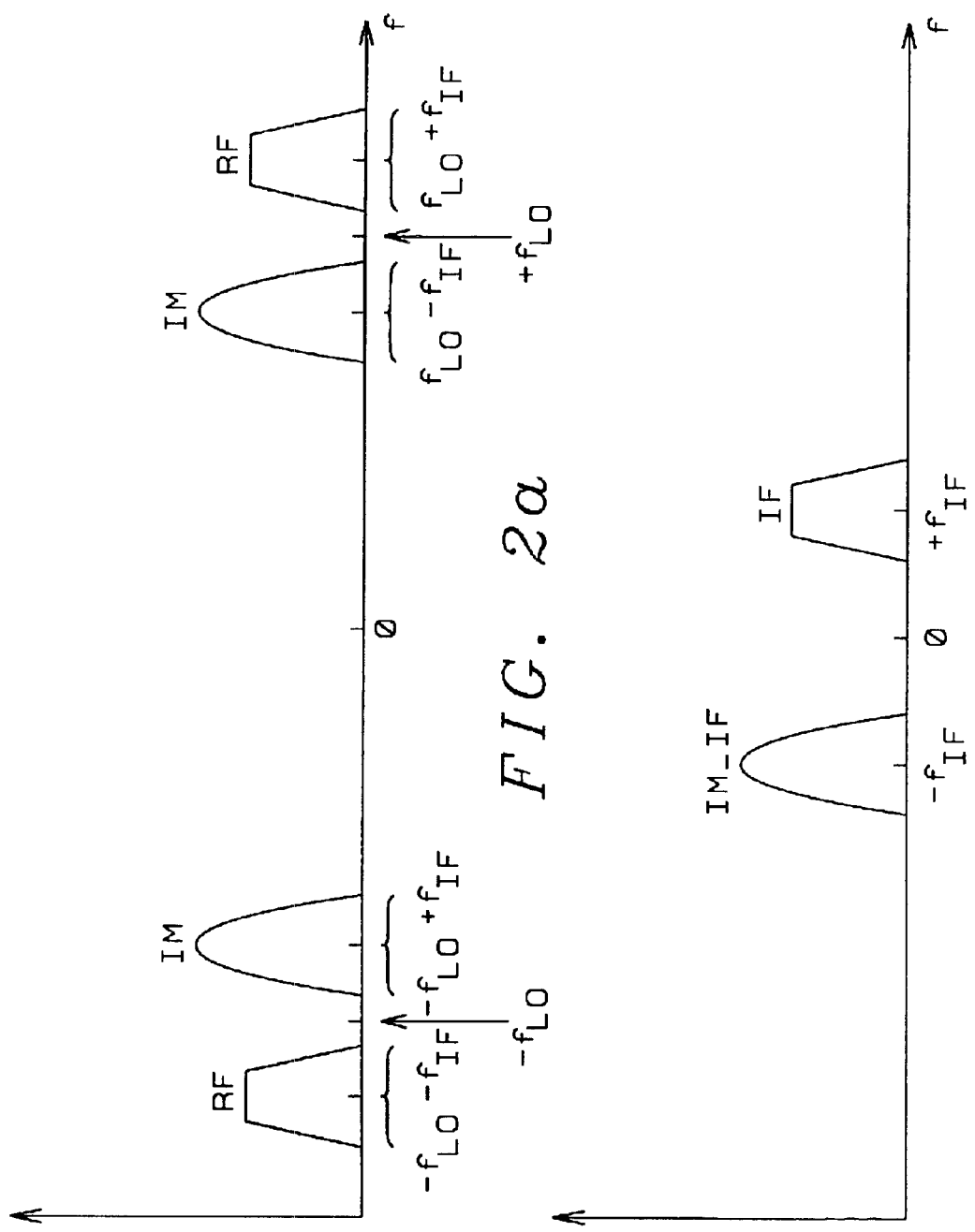

In the forward path, the input signal x(t), composed of desired RF and image (IM) signal (indicated as RF+IM), comes from a low noise amplifier (LNA). Its spectrum is shown in FIG. 2(a) where the RF spectrum part and image spectrum part are located at the two sides of the LO frequency $f_{LO}$. The frequency spacing between the central frequency of these two signals is $2f_{IF}$. Quadrature Mixer_I 10a and Mixer_Q 10b are used for downconversion of incoming RF+IM signal. Ideally, the I/Q LO input signals $p_I(t)$ and $p_Q(t)$ should have fixed 90° phase difference and equivalent amplitude. Firstly let us consider the case of perfect matching in mixers and LOs, i.e., no phase mismatch between I/Q LOs and gain mismatch between I/Q mixers. In this case, the compensator is not required (equivalently, setting α=1, β=0). After downconversion, the signal $s_{CI}(t)$ ($s_I(t)$) and $s_{CQ}(t)$($s_Q(t)$) will have the spectrum as shown in FIG. 2(b). The spectrums of desired RF signal and the image signal (labeled RF and IM in FIG. 2(a)) are shifted to the IF band located on two sides of the zero frequency, respectively (IF and IM_IF in FIG. 2(b)). The complex filter signal extractor is made up of two complex filters. One (CF_RF) is tuning its central frequency to $f_{IF}$ and has only a positive frequency passband. The other (CF_IM) is tuning its central frequency to $-f_{IF}$ and has only a negative frequency passband (see FIG. 2(c)). The operation of filtering is shown as FIG. 2(c) and by this method the desired IF signal will be separated from the image IF signal. Then the filtered low IF signal can be further converted to a baseband signal through an A/D converter.

If there exist mismatches between I/Q LOs and mixers, some of the image IF signal will leak into the desired IF signal passband and also some of the desired IF signal will leak into the image IF signal passband. After filtering, the spectra are shown in FIG. 2(d) and FIG. 2(e). Obviously, the IF signal and the IM_IF signal will become correlated since part of the IF (IM_IF) signal is in the same band as the IM_IF (IF) signal. The idea unique to this invention is to introduce a feedback loop to automatically cancel the mismatch by employing the correlation characteristics of the desired IF and image signal. Through continuously adjusting the gain α and β (see compensator, FIG. 1), the mismatch will be continuously reduced and the IRR can be continuously increased. The basic principle is as follows. If the separated desired IF signal and image IF signal are correlated, the correlation of these two signals will be larger than zero. A correlator is used to calculate the correlation value and thus can be used to detect the I/Q mismatch. A gain mismatch estimator is used to decide automatically the orientation of the adjusting (adding or reducing) of the gains α and β. To implement this, the adjusting of the value of α or β in current time will be determined by both the changed values of α or β in the last time and the changed value of $c_r(t)$ in the last time, see FIG. 1. The adjusting of gain should be in a way, which will force $c_r(t)$ to continuously decrease. After the compensation by the compensator, the mismatch between signal $s_{CI}(t)$ and $s_{CQ}(t)$ will be greatly reduced no matter how large a mismatch exists between $s_I(t)$ and $s_Q(t)$, and thus the IRR will be significantly improved.

In the following, the function of each building block is described in details.

1. The Problem of Image Rejection in Low IF Receiver

Assume x(t) in FIG. 1 is the amplified signal gained from the LNA, which is composed of desired RF signal, image signal and other interference signal. After the downconversion by I/Q mixers and filtering of a complex filter, the desired RF signal will be transformed to an IF signal and at the same time the image signal and interference signal will be eliminated.

Assume the I/Q LO signals are:

$$p_I(t)=A\cos(\omega_{LO}t+\phi), \quad (1)$$

$$p_Q(t)=\sin(\omega_{LO}t). \quad (2)$$

Here A represents the equivalent gain mismatch (if A≠1) and φ represents the equivalent phase mismatch (if φ≠0) between the I path and the Q path of the downconversion system. $\omega_{LO}$ denotes the local oscillation frequency of the local oscillators.

Mixing x(t) with LO signals through I/Q mixers to get:

$$s_I(t)=Ax(t)\cos(\omega_{LO}t+\phi), \quad (3)$$

$$s_Q(t)=x(t)\sin(\omega_{LO}t). \quad (4)$$

Here $s_I(t)$ and $s_Q(t)$ will have amplitude mismatch A and phase mismatch φ. If they are directly passed into a complex filter for the extraction of the desired IF signal and the rejection of the image IF signal, the image rejection ratio (IRR) cannot be high since it is very sensitive to the mismatch between the I path and the Q path (commonly around 30 dB). In high performance transceiver design, high IRR (at least >55 dB) is desired and this motivates us to propose the following self-calibrated and tuned image rejection downconversion architecture.

2. A Compensator for Eliminating the Mismatch

After the I/Q mixers, we can use two voltage gain amplifiers (VGA) 51a, 51b as a compensator in FIG. 1 to adjust the amplitudes of the I/Q signals and then combine them as:

$$s_{CI}(t)=s_I(t)=Ax(t)\cos(\omega_{LO}t+\phi), \quad (5)$$

$$s_{CQ}(t)=\alpha s_Q(t)+\beta s_I(t). \quad (6)$$

If $\alpha$ and $\beta$ are adjusted to the values:

$$\alpha = \frac{A}{\cos(\varphi)}, \quad (7)$$

$$\beta=\tan(\phi), \quad (8)$$

Substituting (7) and (8) into (6), it is easily to prove that $$s'_{CQ}(t)=Ax(t)\sin(\omega_{LO}t+\phi). \quad (9)$$

Comparing (5) with (9), we see that there will be no mismatch between the compensated I/Q signals $s_{CI}(t)$ and $s'_{CQ}(t)$ if the gains $\alpha$ and $\beta$ are set as (7). Then, if $s_{CI}(t)$ and $s'_{CQ}(t)$ are put into the complex filter for image rejection, very high IRR can be gotten (for example, >62 dB by using a $4^{th}$ order Butterworth complex filter). However, since the mismatch values of A and $\phi$ for a receiver are unknown, and thus the desired compensation values of $\alpha$ and $\beta$ are not available, they have to be estimated before making compensation.

3. Complex Filter Pairs for Signal and Image Separation

Complex filters can be used to extract and separate the desired IF signal from the image IF signal. Without loss of generality, it is assumed after downconversion that the desired IF signal lies in the positive frequency band and the image IF signal lies in the negative frequency band. A complex filter with all its poles above the real axis has only a band pass selectivity in positive frequency band, and a complex filter with all its poles below the real axis has only a band pass selectivity in negative frequency band. These characteristics can be used to separate the desired IF signal from the image IF signal.

A complex filter with positive frequency passband is used for extracting the desired IF signal, and also a complex filter with negative frequency passband is used for extracting the image IF signal in the block complex filter signal extractor 20 in FIG. 1. After the processing with this signal extractor, desired IF I/Q signal $r_I(t)$ and $r_Q(t)$ (IF_I, IF_Q) are separated from the image IF I/Q signal $m_I(t)$ and $m_Q(t)$ (IM_IF_I, IM_IF_Q). Then $r_I(t)$ and $r_Q(t)$ will be combined as a complex signal $r(t)=r_I(t)+jr_Q(t)$, and $m_I(t)$, and $m_Q(t)$ will be combined as a complex signal $m(t)=m_I(t)+jm_Q(t)$ in Blocks 60a and 60b, respectively. If $s_{CI}(t)$ and $s_{CQ}(t)$ have no mismatch, r(t) and m(t) will be uncorrected since they lie in different frequency bands. However, if $s_{CI}(t)$ and $s_{CQ}(t)$ mismatch, r(t) and m(t) become correlated. The main reason for this is—if there is an I/Q mismatch and after complex filtering—that some of the image IF signal will leak into the desired IF signal passband and also some of the desired IF signal will leak into the image IF signal passband, as shown in FIGS. 2(d) and (e). Hence r(t) and m(t) become correlated. This important feature will be used to detect the signal mismatches between the I and Q path.

4. A Correlator for Detecting the Mismatch

The correlator in FIG. 1 is defined as:

$$c_r(t) = \frac{E(r(t)m(t))}{E(r^2(t)) + E(m^2(t))}. \quad (10)$$

Where E( ) represents the assemble average. Obviously, if there is no mismatch between the signal $s_{CI}(t)$ and $s_{CQ}(t)$, the output of the correlator $c_r(t)$ will be zero. Otherwise, if there are any amplitude and/or phase mismatches between $s_{CI}(t)$ and $s_{CQ}(t)$, the output of the correlator $c_r(t)$ will be larger than zero. Moreover, the larger the mismatches are, the larger the correlator outputs.

The key idea of the proposed scheme is to try to self-adjust the gain $\alpha$ and $\beta$ through a closed feedback loop, which forces the value $c_r(t)$ to continuously decrease to as small as possible. In the ideal case, $c_r(t)$ will be adjusted down to zero and thus the mismatch between $s_{CI}(t)$ and $s_{CQ}(t)$ will be eliminated completely.

5. Mismatch Estimation and Canceling Scheme

The gain mismatch estimator in FIG. 1 is used to continuously estimate and adjust the values of $\alpha$ and $\beta$. The function of this block can be summarized as the following recursive processing procedure.

% - - - %

Set Initial Values:

$h(0)=h(1)=1;$ $d(0)=d(1)=1;$ $\alpha(0)=\alpha(1)=1;$ $\beta(0)=\beta(1)=1;$ $t=2.$ While $c_r(t)>T_h$ $$\alpha(t)=\alpha(t-2)-h(t-2)d(t-2)\Delta\alpha(t), \quad (11a)$$

$$h(t)=\text{sign}(\alpha(t)-\alpha(t-2)), \quad (11b)$$

$$d(t)=\text{sign}(c_r(t)-c_r(t-2)); \quad (11c)$$

$$\beta(t+1)=\beta(t-1)-h(t-1)d(t-1)\Delta\beta(t), \quad (12a)$$

$$h(t+1)=\text{sign}(\beta(t+1)-\beta(t-1)), \quad (12b)$$

$$d(t+1)=\text{sign}(c_r(t+1)-c_r(t-1)); \quad (12c)$$

$t=t+2.$

End

% - - - %

Here sign( ) is defined as $$\text{sign}(x) = \begin{cases} 1 & x > 0 \\ 0 & x = 0 \\ -1 & x < 0. \end{cases}$$

Where $T_h$ representing a threshold is a very small positive constant value, and $\Delta\alpha$, $\Delta\beta>0$ are the adjusting step values. From above, we can see that $\alpha$ and $\beta$ are alternatively adjusting in time t and t+1. The adjusting value of $\alpha$ or $\beta$ in current time (t or t+1) is determined by both the changed value of $\alpha$ or $\beta$ in the last time (t−2 or t−1) and the changed value of $c_r(t)$ in the last time (t–2 or t–1). The value $\alpha$ and $\beta$ are modified in the direction which will promote $c_r(t)$ has the tendency to decrease. For example, if $\alpha(t-2)>\alpha(t-4)(h(t-2)>0$, (11b)) leads $c_r(t-2)<c_r(t-4)(d(t-2)<0$, (11c)), we have $\alpha(t)=\alpha(t-2)-1\times(-1)\times\Delta\alpha(t)=\alpha(t-2)+\Delta\alpha(t)$ in (11a). This means if the increase of $\alpha$ in time t–2 leads the decrease of $c_r$ in time t–2, $\alpha$ should be increased further more at time t so that $c_r$ potentially can be further decreased at time t. On the other hand, if $\alpha(t-2)>\alpha(t-4)(h(t-2)>0$, (11b)) leads $c_r(t-2)>c_r(t-4)$ $(d(t-2)>0$, (11c)), we have $\alpha(t)=\alpha(t-2)-1\times 1\times\Delta\alpha(t)=\alpha(t-2)-\Delta\alpha(t)$ in (11a). This means if the increase of $\alpha$ in time t–2 leads the increase of $c_r$ in time t–2, $\alpha$ should be decreased at time t so that $c_r$ can be potentially decreased at time t. The same operation is done to $\beta$. It can be easily verified that the scheme in (11) and (12) will force the value of $c_r(t)$ to continually decrease and thus to continually improve the IRR with time until a very high IRR is attained. Essentially, the above algorithm is a simplified adaptive least mean square (LMS) algorithm. See S. S. Haykin, "Adaptive Filtering Theory", NJ: Prentice Hall, 1996. Therefore, all LMS algorithm related techniques can be used to further improve the present algorithm performance (but, of course, with more complexity). It should be noted that the selection of parameters $T_h$, $\Delta\alpha$ and $\Delta\beta$ are a trade off between the estimation convergent rate and the estimation accuracy. The smaller $T_h$, $\Delta\alpha$ and $\Delta\beta$ are chosen, the more accurate estimates of desired $\alpha$ and $\beta$ can be gotten, and the slower the estimation converges.

6. Method of the Invention

Figure 5:
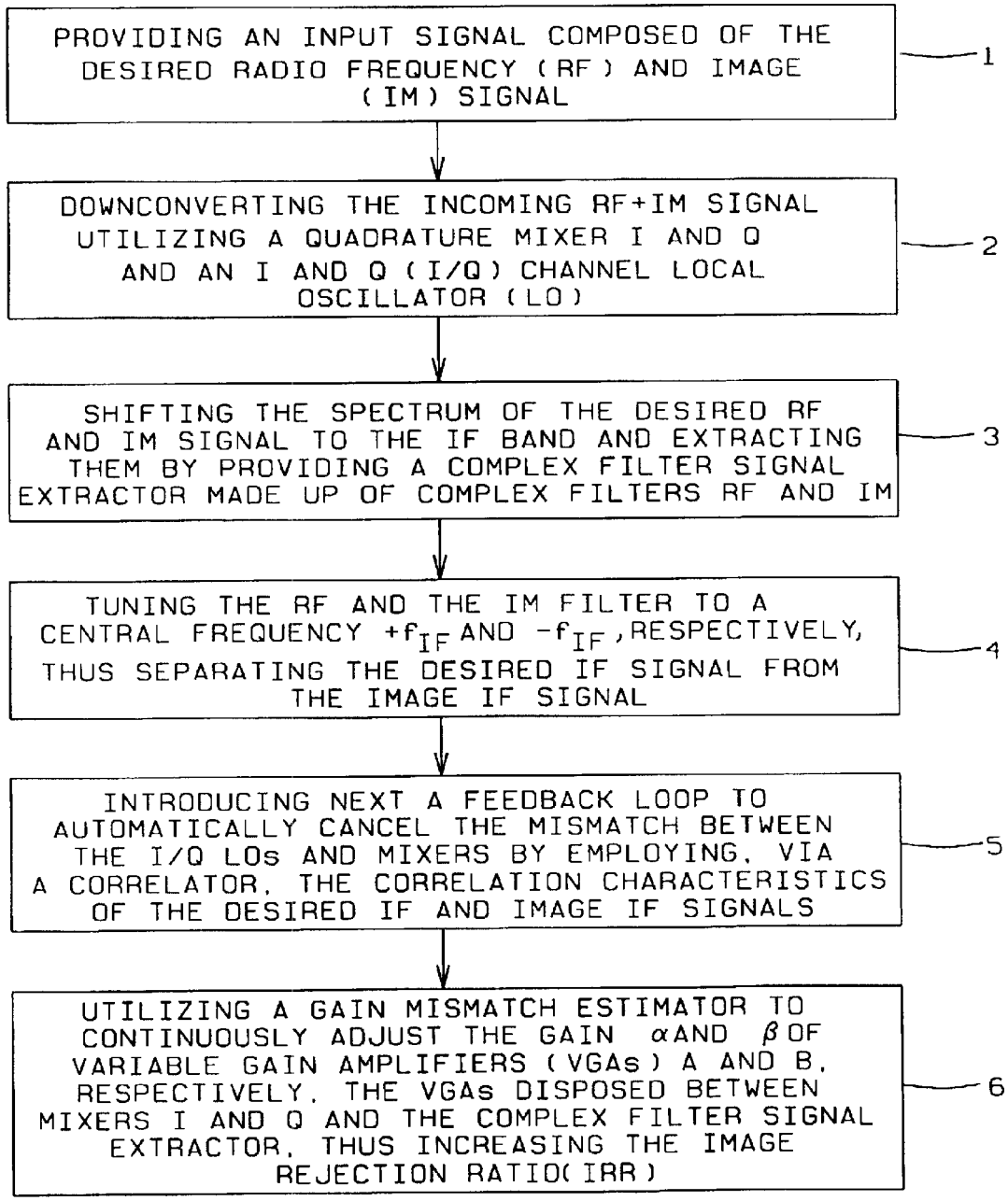
FIG. 5 is a block diagram of the method of the preferred embodiment of the invention.

Referring to FIG. 5, we now describe the preferred method of the present invention:

Block 1 describes providing an input signal composed of the desired radio frequency (RF) and image (IM) signal. Also refer to FIG. 2(a) and its description earlier in the text.

Block 2 describes downconverting the incoming RF+IM signal utilizing a quadrature mixer I and Q and an I and Q (I/Q) channel local oscillator (LO). Refer to FIG. 2(b) and its description earlier in the text.

Block 3 describes providing a complex filter signal extractor made up of complex filters RF and IM and shifting and extracting the spectrum of the desired RF and IM signal to the IF band. Refer to FIG. 2(c), and its description earlier in the text.

Block 4 describes tuning the RF and the IM filter to a central frequency $+f_{IF}$ and $-f_{IF}$, respectively, thus separating the desired IF signal from the image IF signal. Refer to FIG. 2(c) and its description earlier in the text. The dotted outlines in FIG. 2(c) illustrate the effect of the complex filter.

Block 5 describes introducing next a feedback loop to automatically cancel the mismatch between the I/Q LOs and the quadrature mixers by employing, via a correlator, the correlation characteristics of the desired IF and image IF signals. Refer to correlator 30 in FIG. 1.

Block 6 describes utilizing a gain mismatch estimator to continuously adjust the gain $\alpha$ and $\beta$ of variable gain amplifiers (VGAs) A and B, respectively, where the VGAs are disposed between mixers I and Q and the complex filter signal extractor, thus increasing the image rejection ratio (IRR). Refer to the gain mismatch estimator in FIG. 1 and FIGS. 3(c) and 3(f).

Verifications and Results

To verify the feasibility and evaluate the performance of the proposed new architecture, a dynamic simulation using MATLAB SIMULINK 2.0 has been done. In this simulation, the performance of the proposed downconversion system applied to a Bluetooth low IF receiver (assuming FM modulation) is investigated and illustrated. In fact, the proposed new self-tuned image rejection downconversion system (circuits) can be widely used in most of wireless communication applications such as GSM, DECT, WCDMA, and wireless LAN etc.

FIGS. 3(a–c) shows the SIMULINK simulation set up for the self calibrated and tuned image rejection downconversion system. FIGS. 3(a), 3(b), and 3(c) make up one Figure. FIG. 3(a) connects to FIG. 3(b) via connections 31, 32, 33 and to FIG. 3(c) via connections 34, 35. FIG. 3(b) connects to FIG. 3(c) via connection 36. Referring to FIG. 3(a) now, Blocks LO_I 310a and LO_Q 310b simulate the I/Q local oscillation signals. Blocks MIXER_I 312a and MIXER_Q 312b simulate the I/Q mixers. Blocks Alpha 314a and Beta 314b simulate compensators. Blocks RF_extractor 316a plus and IM_extractor 316b simulate the complex filter signal extractor in FIG. 1. Block CF3 313 is used to simulate a complex filter whose input signals are not compensated, while RF_extractor 316a IM_extractor 316b are used to simulate the complex filter signal extractor whose input signals are compensated. Here each of the complex filters (316a–b and 313) is implemented with a $4^{th}$ order Butterworth complex filter. Blocks 318a and 318b represent the I and Q signal combiner for 316a and 316b, respectively. Correlator 319 in FIG. 3(b) is used to simulate correlator 30 in FIG. 1. Blocks Corr_dec_alpha 320a and Corr_dec_beta 320b, Alpha_estimator 322a, and Beta_estimator 322b in FIG. 3(c) are used to simulate the gain mismatch estimator 40 in FIG. 1. Block Image Rejection Ratio 326 in FIG. 3(b) displays the image rejection ratio of the simulation model. Moreover, the detailed SIMULINK model of the complex filter cells CF3 313, correlator cell Correlator 319, and gain mismatch estimator cell (320a–b and 322a–b) are shown in FIGS. 3(d), 3(e), and 3(f), respectively.

Figure 3A:
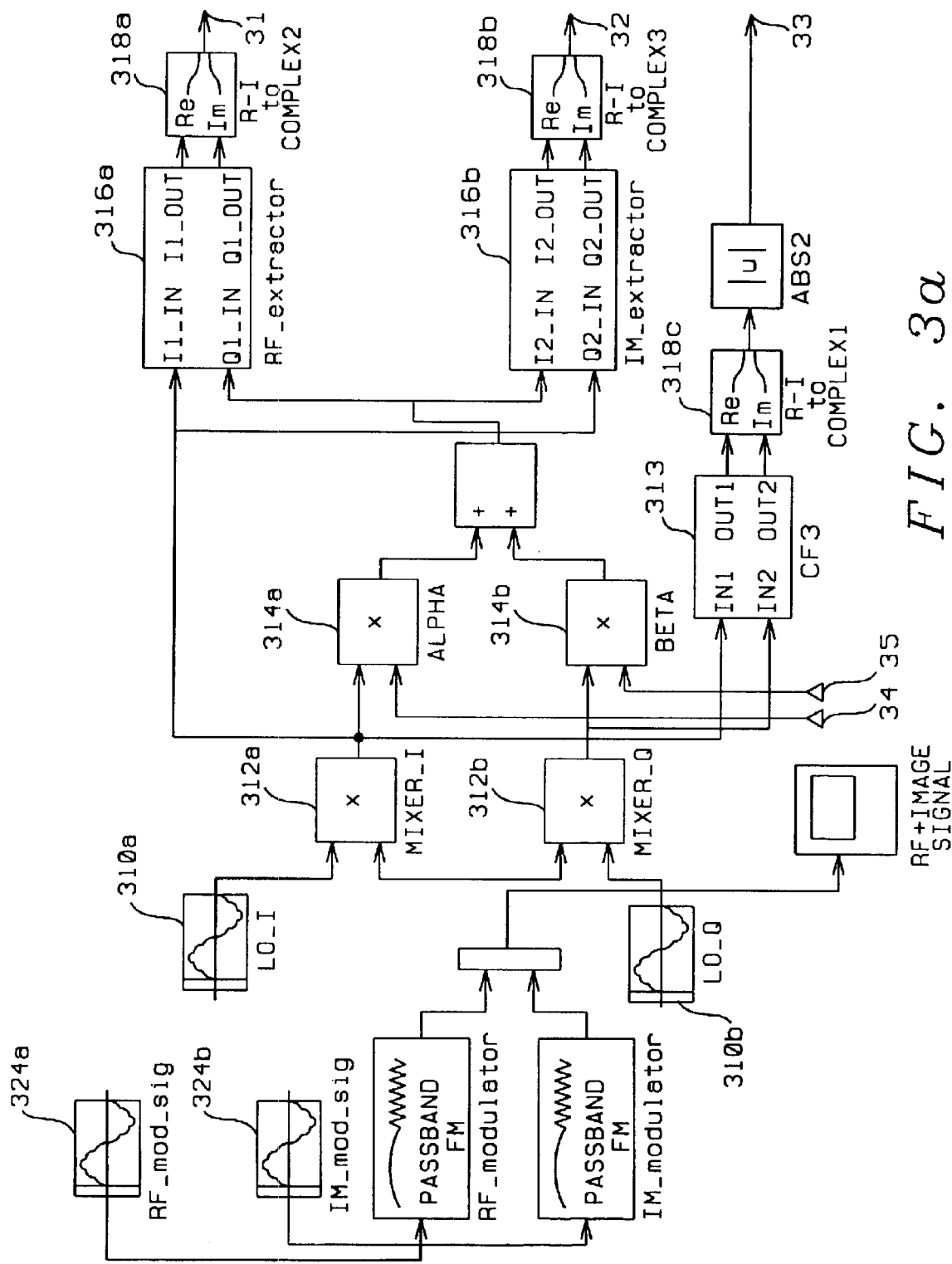
Figure 3B:
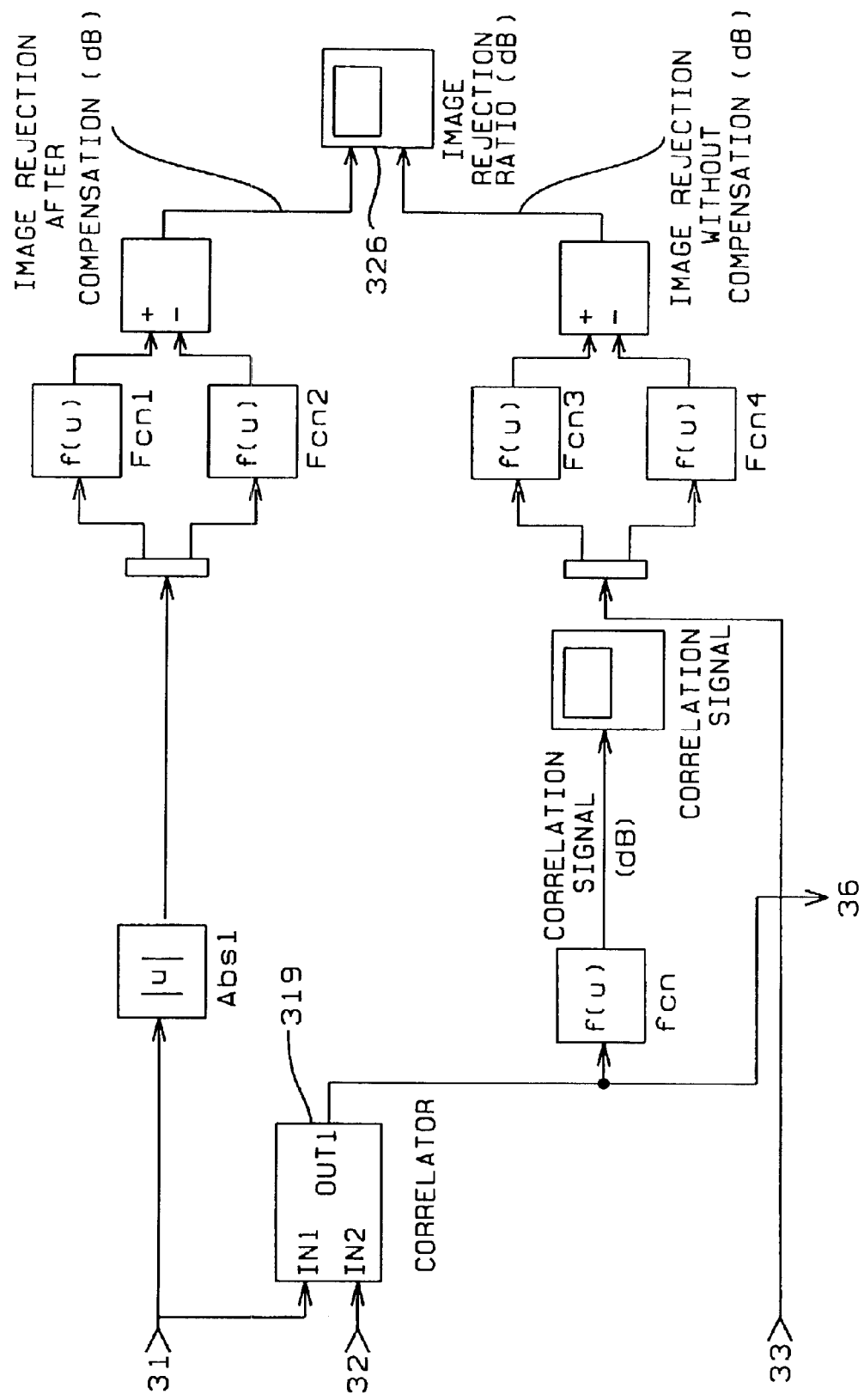
Figure 3C:
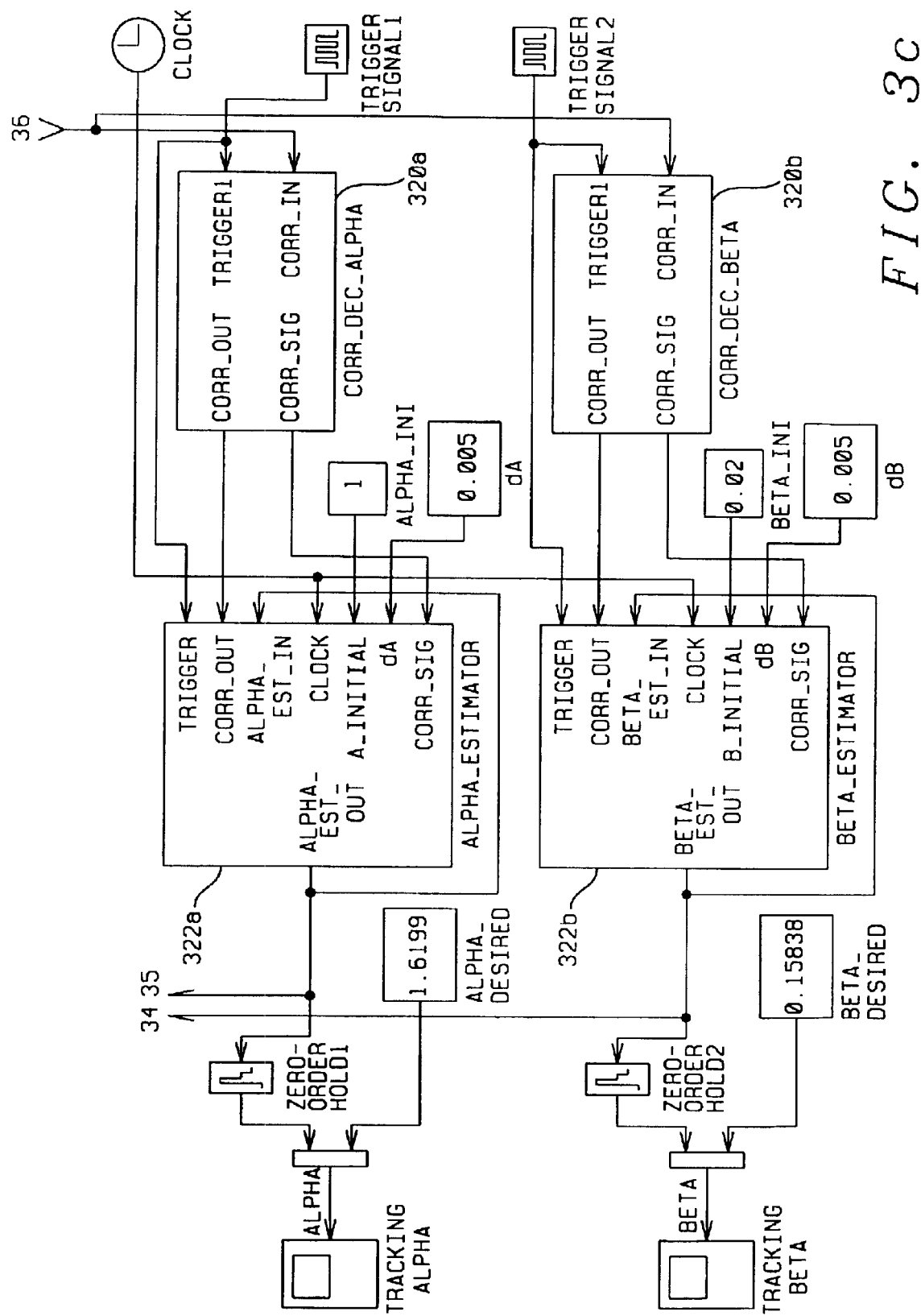
Figure 3D:
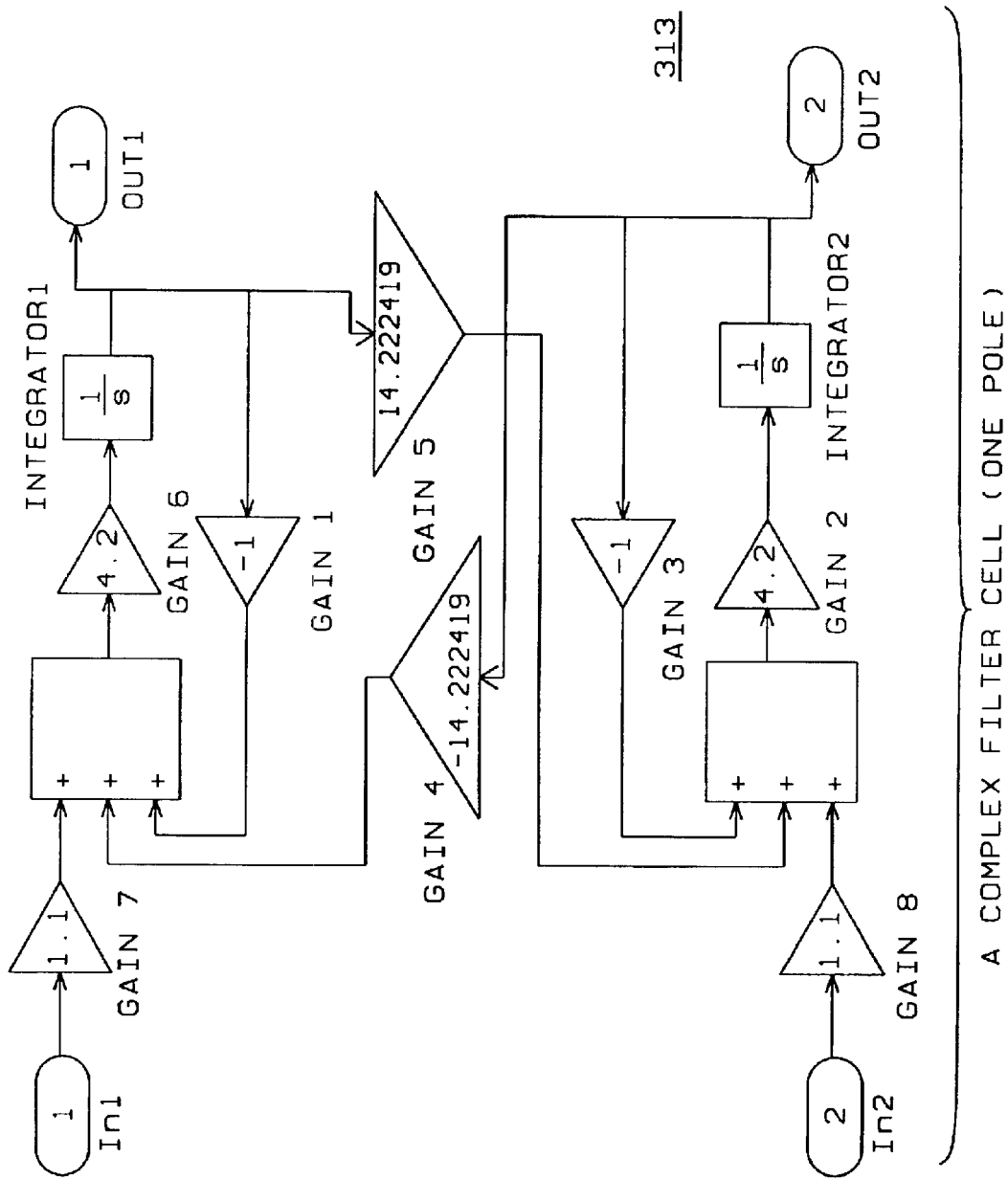
Figure 3E:
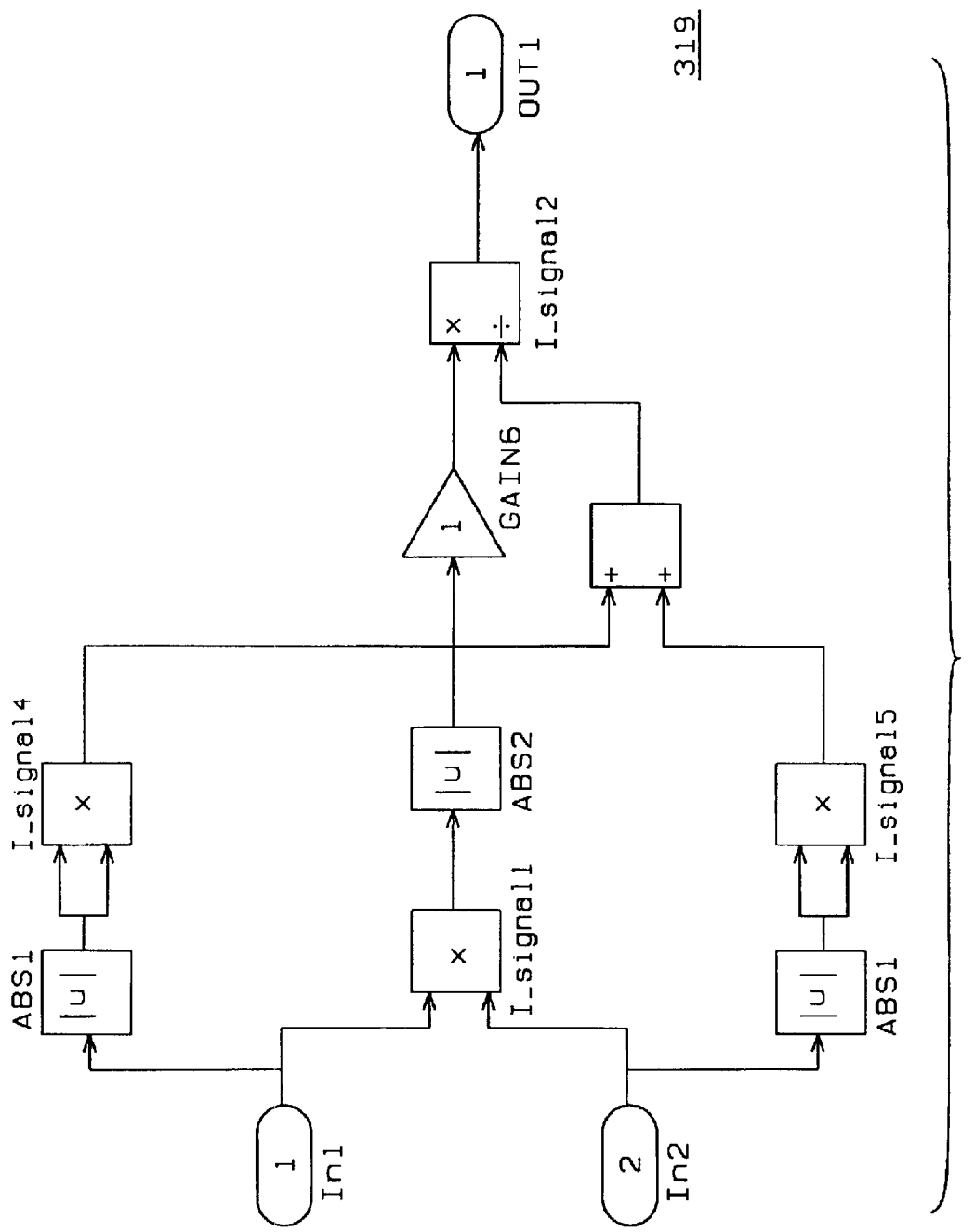

The input signal sources are represented in FIG. 3(a) by two frequency modulated (FM) signals RF_mod_sig 324a and IM_mod_sig 324b which represent the desired RF and IM signals, respectively. The carrier frequency of the desired RF signal is 2.4 GHz and the carrier frequency of the IM signal is 2.38 GHz, thus the central frequency of IF signal is 10 MHz ((2.4–2.38)/2*$10^3$ MHz). The modulation signal for the RF carrier is a pulse wave with period 1 $\mu$s (frequency 1 MHz). The modulation signal for the IM carrier is a sine wave with period 1 $\mu$s (frequency 1 MHz). The central frequency of the complex filters is tuned to ±10 MHz and its bandwidth is designed as 2 MHz. Assume the equivalent amplitude mismatch is A=1.6 (60%) and the phase mismatch is $\phi=9°$ (10%), and thus the desired $\alpha$ and $\beta$ for compensation can be calculated as $\alpha'=1.61994$ and $\beta'=0.15838$. Setting the minimum adjusting step for $\alpha$ to $\Delta\alpha=0.01$ and the minimum adjusting step for $\beta$ to $\Delta\beta=0.01$. In the whole simulation a sampling rate of $5\times10^{10}$ samples/s is used.

Figure 4A:
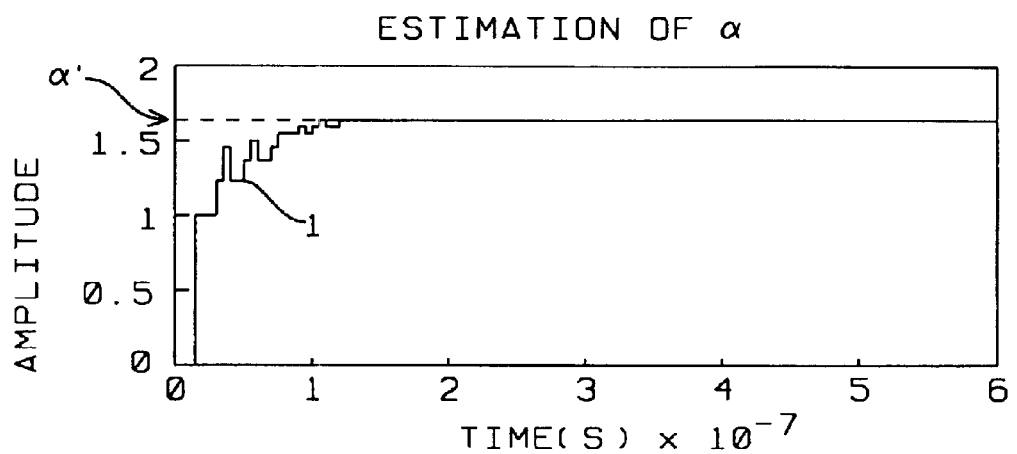
FIGS. 4(a)–(e) are graphs of the simulation results.
Figure 4B:
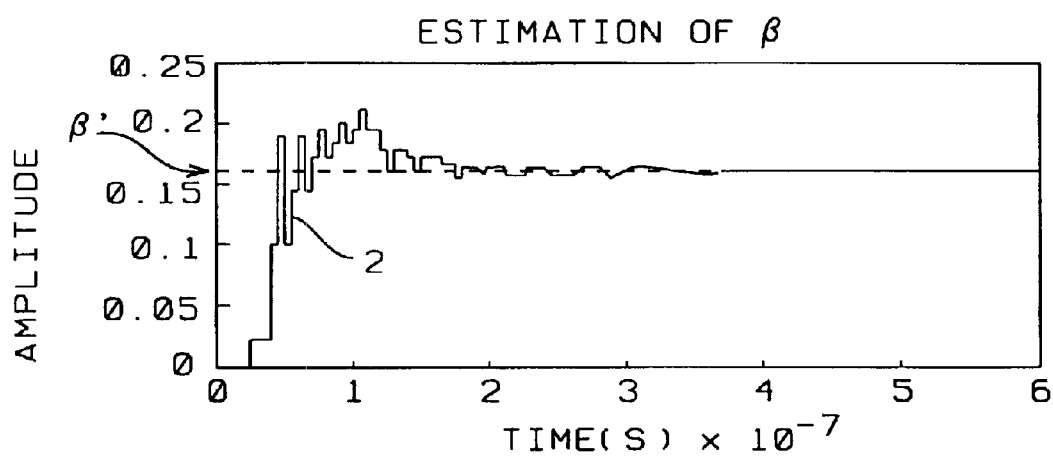
Figure 4C:
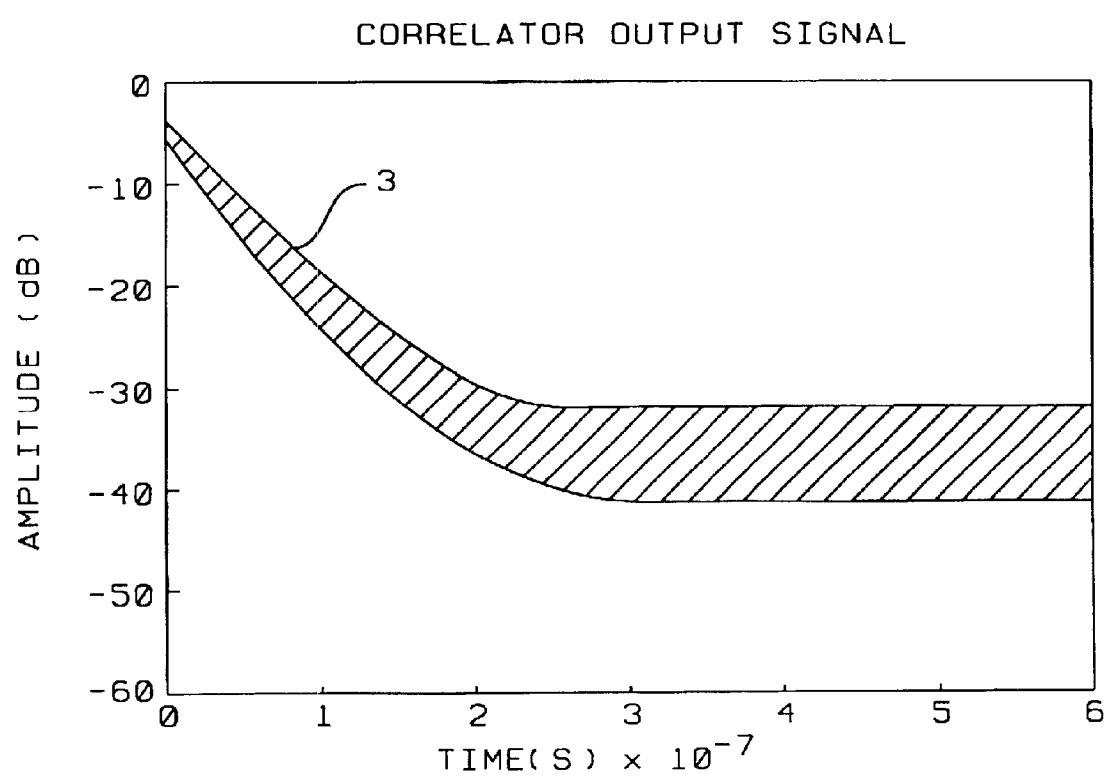
Figure 4D:
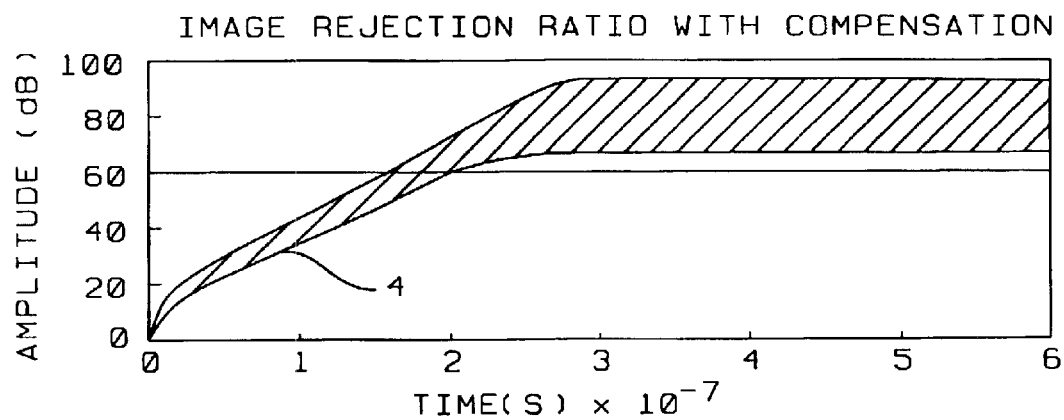
Figure 4E:
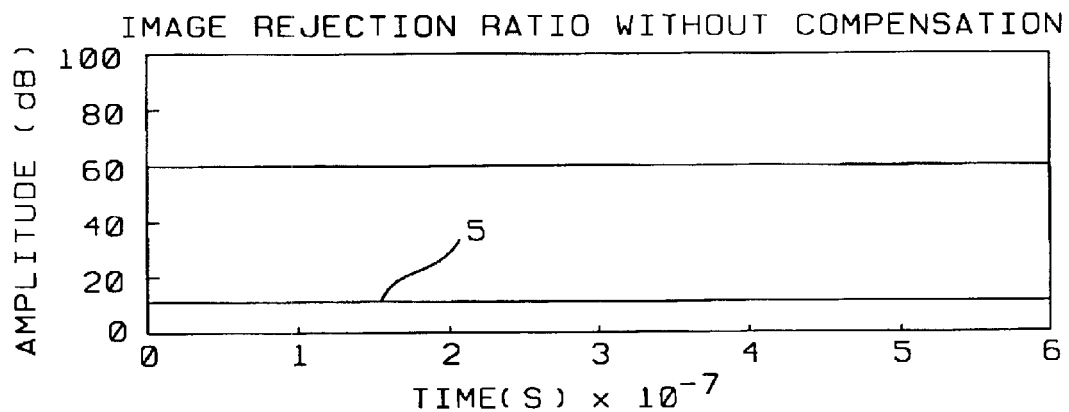

The simulation results are shown in FIGS. 4(a) to 4(e). Curves 1, 2 show the estimation of $\alpha$, $\beta$ in FIGS. 4(a), 4(b), respectively. From initial values 0, the estimates of $\alpha$ and $\beta$ converge to the desired values of $\alpha'$ and $\beta'$ taking about 0.25 $\mu$s. The output signal of the correlator, Curve 3, is shown in FIG. 4(c) which continuously decreases from 0 dB to about –38 dB taking about 0.3 $\mu$s. After that, it converges and varies in a relatively small range. FIGS. 4(d) and 4(e) show the results of image rejection ratio with and without compensation, respectively. It can be seen from Curve 5 that the IRR is only about 16 dB without compensation while with compensation, Curve 4, the IRR is continuously improved until an average 70 dB IRR is gained when the compensation converges. The settling time is about 0.2 $\mu$s to 0.3 $\mu$s. After the stability of compensation, the feed back loop can be broken and then the forward path works in an open loop mode, which still can provide reliable IRR over 60 dB in most applications.

Analog Circuit Implementation

Consider now the implementation issue of the proposed architecture. In the forward path, the mixers and the complex filters can be implemented in analog integrated circuits, see the J. Crols and M. Steyaert, CMOS Wireless Transceiver Design and T. H. Lee articles discussed earlier in the Background of the Invention. In the feedback path, the correlator and the gain mismatch estimator can be implemented using digital circuits as well as analog circuits. A promising way is to implement the whole feedback path with analog circuits. For example, the correlator can be implemented using analog multipliers and a lowpass filter K. Bult and H. Wallinga, "A CMOS four quadrant analog multiplier," *IEEE Journal of Solid State Circuits*, vol. 21, no. 3, pp. 430–435, 1986 and R. Gregorian and G. C. Temes, *Analog MOS Integrated circuits for Signal Processing*, NJ: John Wiley and Sons, 1986. The gain mismatch estimator can be implemented using operational amplifier based comparator D. A. Johns and K. Martin, *Analog Integrated Circuit Design*, NJ: John Wiley and Sons, 1997, and the R. Gregorian article referred to above. The two VGAs can be implemented using two high linear analog multipliers and analog adders, see S. Hsiao and C. Wu, "A Parallel Structure for CMOS four quadrant analog multipliers and its applications to 2 GHZ RF downconversion Mixers," *IEEE Journal of Solid State Circuits*, vol. 33, no. 6, pp. 859–869, 1998 and the K. Bult article referred to earlier. In this sense, the proposed high image rejection downconversion system can be fully integrated in analog circuits, and thus potentially can be developed as an analog chipset applying to the low IF receiver.

Advantages

In summary, the advantages of the present invention are:
1. The new invention is a self-tuned system. The I/Q mismatch in the forward path of a receiver can be automatically canceled using the received RF and image signal. No extra calibration signal is required.
2. The new invention can work on-line with a very fast settling time. No matter how large a phase and gain mismatch exists, the system can always compensate it to a very small degree when the adjustment through feedback converges.
3. The new invention can achieve high precision compensation and thus a high image rejection ratio (over 62 dB) can be gained, which promotes it for use in almost all kinds of high performance wireless communication applications.
4. The new invention can be fully integrated with low cost analog circuits. It can easily be integrated into a single chip RF+IF receiver with very good image rejection performance. Thus, the invented core can be widely used in low cost, low power, and high performance chipsets, such as a CMOS Bluetooth and Wireless LAN transceiver chipsets.
5. Since only the amplitude adjustors (i.e., VGAS) are used in the invention to compensate the I/Q phase mismatch, the phase error detector and phase shifter (for compensation) are not required. The complexity of the compensation circuit has been greatly reduced and the adjustment precision has also been greatly improved.

While the invention has been particularly shown and described with reference to the preferred embodiments thereof, it will be understood by those skilled in the art that various changes in form and details may be made without departing from the spirit and scope of the invention.

What is claimed is:

1. A fully integrated self-tuned image rejection downconversion system with feedback for use in low intermediate frequency (IF) receivers with high image rejection ratio, comprising:

a forward path, receiving a radio frequency (RF) and image (IM) signal, said forward path comprising quadrature I and Q (I/Q) channel mixers with an I/Q local oscillator (LO) each, and a complex filter signal extractor, said complex filter signal extractor extracting an IF and an IF image signal, said forward path used for frequency conversion; and a feedback path, receiving the output of said forward path, said feedback path comprising a correlator, a gain mismatch estimator and variable gain amplifiers (VGAs), said VGAs disposed between said I/Q mixers and said complex filter signal extractor, said closed loop feedback path used for detecting, estimating, and canceling I/Q mismatches between said I/Q mixers and said I/Q local oscillators (LOs).

2. The self-tuned image rejection downconversion system of claim 1, wherein said correlator is used to calculate the correlation value between said extracted IF and said IF image signal which is used to detect the I/Q mismatch.

3. The self-tuned image rejection downconversion system of claim 1, wherein said gain mismatch estimator is used to decide automatically the direction of the adjusting of the compensation gain of said VGAs.

4. The self-tuned image rejection downconversion system of claim 3, wherein the direction of the adjusting of the compensation gain of said VGAs is both additive and subtractive.

5. The self-tuned image rejection downconversion system of claim 1, wherein two variable VGAs are used to eliminate I/Q phase and I/Q gain mismatches of said I/Q LOs and said I/Q mixers, respectively.

6. The self-tuned image rejection downconversion system of claim 1, wherein a high image rejection ratio (IRR) can be reliably achieved, regardless of how large a mismatch between said I and said Q channel exists.

7. The self-tuned image rejection downconversion system of claim 1, wherein the I/Q matching of said closed loop feedback path is self-tuning.

8. A fully integrated self-tuned image rejection downconversion system with feedback for use in low intermediate frequency (IF) receivers with high image rejection ratio, comprising:

a forward path, receiving a combined radio frequency (RF) and image (IM) signal (RF+IM), said forward path comprising an I and a Q (I/Q) local oscillator (LO), a quadrature I and a Q (I/Q) channel mixer, a compensator, and a complex filter signal extractor, said quadrature I channel mixer receiving said RF+IM signal and a signal from said I LO, said quadrature Q channel mixer receiving said RF+IM signal and a signal from said Q LO, said I/Q channel mixer downconverting said RF+IM signal, said compensator receiving output signals SI and SQ from said I/Q channel mixer, said compensator, comprising two variable gain amplifiers (VGA), compensating for the mismatch of said output signals SI and SQ, said complex filter signal extractor receiving signals SCI and SCQ from said compensator, said complex filter signal extractor extracting an IF and an IF image signal and providing said extracted IF and IF image signal at the output of said forward path, said forward path used for frequency conversion; and a feedback path comprising a correlator, and a gain mismatch estimator, said correlator receiving the output of said forward path, said correlator calculating the correlation between said desired extracted IF and IF image signal, said gain mismatch estimator receiving a signal from said correlator, said gain mismatch estimator adjusting the gain of said first and said second VGA, said closed loop feedback path thereby detecting, estimating, and canceling I/Q mismatches between said I/Q mixers and said I/Q local oscillators (LOs).

9. The self-tuned image rejection downconversion system of claim 8, wherein said gain mismatch estimator is used to decide automatically the direction of the adjusting of the compensation gain of said VGAs.

10. The self-tuned image rejection downconversion system of claim 9, wherein the direction of the adjusting of the compensation gain of said VGAs is both additive and subtractive.

11. The self-tuned image rejection downconversion system of claim 8, wherein two variable VGAs are used to eliminate I/Q phase and I/Q gain mismatches of said I/Q LOs and said I/Q mixers, respectively.

12. The self-tuned image rejection downconversion system of claim 8, wherein a high image rejection ratio (IRR) can be reliably achieved, regardless of how large a mismatch between said I and said Q channel exists.

13. The self-tuned image rejection downconversion system of claim 8, wherein the I/Q matching of said closed loop feedback path is self-tuning.

14. The self-tuned image rejection downconversion system of claim 8, wherein said complex filter signal extractor separates said desired extracted IF and IF image signal through the uses of a complex filter with positive and negative frequency passband.

15. A fully integrated self-tuned image rejection downconversion system with feedback for use in low intermediate frequency (IF) receivers with high image rejection ratio, comprising:

a forward path, receiving a combined radio frequency (RF) and image (IM) signal (RF+IM), said forward path comprising an I and a Q (I/Q) local oscillator (LO), a quadrature I and a Q (I/Q) channel mixer, a compensator, and a complex filter signal extractor, said quadrature I channel mixer receiving said RF+IM signal and a signal from said I LO, said quadrature Q channel mixer receiving said RF+IM signal and a signal from said Q LO, said I/Q channel mixer downconverting said RF+IM signal, said compensator receiving output signals SI and SQ from said I/Q channel mixer, said compensator, comprising two variable gain amplifiers (VGA), compensating for the mismatch of said output signals SI and SQ, said complex filter signal extractor receiving signals SCI and SCQ from said compensator, said complex filter signal extractor extracting an IF and an IF image signal and providing said extracted IF and IF image signal at the output of said forward path, said forward path used for frequency conversion;

a feedback path comprising a correlator, and a gain mismatch estimator, said correlator receiving the output of said forward path, said correlator calculating the correlation between said desired extracted IF and IF image signal, said gain mismatch estimator receiving a signal from said correlator, said gain mismatch estimator adjusting the gain of said first and said second VGA, said closed loop feedback path thereby detecting, estimating, and canceling I/Q mismatches between said I/Q mixers and said I/Q local oscillators (LOs);

a first complex signal unit disposed between the output of said complex filter signal extractor and the input of said correlator wherein the desired IF I and Q signals at the output of the complex filter signal extractor will be combined as a complex signal to provide the input to the correlator; and a second complex signal unit disposed between the output of said complex filter signal extractor and the input of said correlator wherein the desired image IF I and Q signals at the output of the complex filter signal extractor will be combined as a complex signal to provide the input to the correlator.

16. The self-tuned image rejection downconversion system of claim 15, wherein said gain mismatch estimator is used to decide automatically the direction of the adjusting of the compensation gain of said VGAs.

17. The self-tuned image rejection downconversion system of claim 16, wherein the direction of the adjusting of the compensation gain of said VGAs is both additive and subtractive.

18. The self-tuned image rejection downconversion system of claim 15, wherein two variable VGAs are used to eliminate I/Q phase and I/Q gain mismatches of said I/Q LOs and said I/Q mixers, respectively.

19. The self-tuned image rejection downconversion system of claim 15, wherein a high image rejection ratio (IRR) can be reliably achieved, regardless of how large a mismatch between said I and said Q channel exists.

20. The self-tuned image rejection downconversion system of claim 15, wherein the I/Q matching of said closed loop feedback path is self-tuning.

21. The self-tuned image rejection downconversion system of claim 15, wherein said complex filter signal extractor separates said desired extracted IF and IF image signal through the uses of a complex filter with positive and negative frequency passband.

22. A method of providing a fully integrated self-tuned image rejection downconversion system with feedback for use in low intermediate frequency (IF) receivers with high image rejection ratio, comprising the steps of:

a) providing an input signal composed of the desired radio frequency (RF) and image (IM) signal;

b) downconverting said incoming RF+IM signal utilizing a quadrature mixer I and Q and an I and Q (I/Q) channel local oscillator (LO);

c) providing a complex filter signal extractor made up of complex filters RF and IM, thereby shifting the spectrum of the desired RF and IM signal to the IF band and extracting said desired RF and IM signal;

d) tuning the RF and the IM filter to a central frequency $+f_{IF}$ and $-f_{IF}$, respectively, thus separating the desired IF signal from the image IF signal;

e) introducing next a feedback loop to automatically cancel the mismatch between said I/Q LOs and said quadrature mixers by employing, via a correlator, the correlation characteristics of the desired IF and image IF signals; and f) utilizing a gain mismatch estimator to continuously adjust the gain $\alpha$ and $\beta$ of variable gain amplifiers (VGAs) A and B, respectively, said VGAs disposed between mixers I and Q and the complex filter signal extractor, thus increasing the image rejection ratio (IRR).

23. The method of claim 22, wherein the desired IF I and Q signals at the output of the complex filter signal extractor are combined into a complex signal to provide the input to the correlator.

24. The method of claim 22, wherein the image IF I and Q signals at the output of the complex filter signal extractor are combined into a complex signal to provide the input to the correlator.

25. The method of claim 22, wherein said gain estimator automatically decides the positive or negative orientation of the adjustment.

26. The method of claim 22, wherein the adjusting of the present value of $\alpha$ and $\beta$ depends on the previous value of $\alpha$ and $\beta$ and the previous input from the correlator.

* * * * *